US008466451B2

(12) United States Patent
Chang et al.

(10) Patent No.: US 8,466,451 B2
(45) Date of Patent: Jun. 18, 2013

(54) SINGLE GATE INVERTER NANOWIRE MESH

(75) Inventors: Josephine Chang, Mahopac, NY (US); Paul Chang, Mahopac, NY (US); Michael A. Guillorn, Yorktown Heights, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/316,515

(22) Filed: Dec. 11, 2011

(65) Prior Publication Data
US 2012/0138888 A1    Jun. 7, 2012

Related U.S. Application Data

(62) Division of application No. 12/470,128, filed on May 21, 2009, now Pat. No. 8,084,308.

(51) Int. Cl.
| H01L 29/06 | (2006.01) |
| H01L 31/00 | (2006.01) |
| H01L 27/105 | (2006.01) |
| H01L 27/148 | (2006.01) |

(52) U.S. Cl.
USPC ............. 257/24; 257/250; 257/251; 257/274; 257/369; 257/E21.641; 257/E27.064; 977/938

(58) Field of Classification Search
USPC ............ 257/24, 250, 251, 274, 369, E21.641, 257/E27.064; 977/938
See application file for complete search history.

(56) References Cited

U.S. PATENT DOCUMENTS

| 6,413,802 | B1 | 7/2002 | Hu et al. | |
| 6,855,606 | B2 | 2/2005 | Chen et al. | |
| 6,998,722 | B2 | 2/2006 | Madurawe | |
| 7,067,867 | B2 | 6/2006 | Duan et al. | |
| 7,462,890 | B1 | 12/2008 | Tombler, Jr. et al. | |
| 7,518,195 | B2 * | 4/2009 | Ernst et al. | 257/401 |
| 2004/0041617 | A1 | 3/2004 | Snider et al. | |
| 2004/0219722 | A1 * | 11/2004 | Pham et al. | 438/157 |
| 2005/0148137 | A1 * | 7/2005 | Brask et al. | 438/216 |
| 2006/0216897 | A1 * | 9/2006 | Lee et al. | 438/282 |
| 2006/0240622 | A1 * | 10/2006 | Lee et al. | 438/257 |
| 2007/0004124 | A1 * | 1/2007 | Suk et al. | 438/238 |
| 2007/0111532 | A1 * | 5/2007 | Lee et al. | 438/745 |
| 2007/0126035 | A1 * | 6/2007 | Ernst et al. | 257/288 |
| 2008/0017934 | A1 * | 1/2008 | Kim et al. | 257/401 |

(Continued)

*Primary Examiner* — Cheung Lee
*Assistant Examiner* — Jeremy Joy
(74) *Attorney, Agent, or Firm* — Vazkan Alexanian; Michael J. Chang, LLC (57) ABSTRACT

A FET inverter is provided that includes a plurality of device layers oriented vertically in a stack, each device layer having a source region, a drain region and a plurality of nanowire channels, wherein the source and drain regions of one or more of the device layers are doped with an n-type dopant and the source and drain regions of one or more other of the device layers are doped with a p-type dopant; a gate common to each of the device layers surrounding the nanowire channels; a first contact to the source regions of the one or more device layers doped with an n-type dopant; a second contact to the source regions of the one or more device layers doped with a p-type dopant; and a third contact common to the drain regions of each of the device layers. Techniques for fabricating a FET inverter are also provided.

15 Claims, 8 Drawing Sheets

U.S. PATENT DOCUMENTS

| | | | |
|---|---|---|---|
| 2008/0102586 A1* | 5/2008 | Park | 438/290 |
| 2008/0135935 A1* | 6/2008 | Cho et al. | 257/347 |
| 2008/0135949 A1* | 6/2008 | Lo et al. | 257/401 |
| 2008/0210981 A1 | 9/2008 | Chang et al. | |
| 2008/0251381 A1 | 10/2008 | Shibata et al. | |
| 2008/0258207 A1* | 10/2008 | Radosavljevic et al. | 257/327 |

* cited by examiner

SINGLE GATE INVERTER NANOWIRE MESH

CROSS-REFERENCE TO RELATED APPLICATIONS

This application is a divisional of U.S. application Ser. No. 12/470,128 filed on May 21, 2009, now U.S. Pat. No. 8,084,308, which is related to the commonly owned U.S. application Ser. No. 12/371,943, entitled "Nanowire Mesh Device and Method of Fabricating Same," filed on Feb. 17, 2009, now U.S. Pat. No. 7,893,492, the contents of each of which are incorporated by reference herein.

FIELD OF THE INVENTION

The present invention relates to nanowire-based devices, and more particularly, to field-effect transistor (FET) logic inverters.

BACKGROUND OF THE INVENTION

In its basic form, a field-effect transistor (FET) includes a source region, a drain region and a channel between the source and drain regions. A gate regulates electron flow through the channel between the source and drain regions.

FETs are used as the basic building blocks for many different types of complementary metal-oxide semiconductor (CMOS) circuitry. For example, logic gate inverters, a common component of many integrated circuit designs, can be formed using one or more complementary pairs of n-channel field-effect transistor (NFET) and p-channel field-effect transistor (PFET) devices. Typical NFET/PFET inverters are configured with the source region of the NFET being connected to the drain region of the PFET, and the gates of the devices being connected to one another.

This standard inverter layout, has a footprint the size of two FETs. Because of the prevalence of inverters in most circuit designs, reducing the layout footprint of the inverter could result in a significant reduction of layout area required to implement most circuit designs.

Therefore, scalable FET inverters and techniques for the fabrication thereof would be desirable.

SUMMARY OF THE INVENTION

The present invention provides nanowire-based devices. In one aspect of the invention, a field-effect transistor (FET) inverter is provided. The FET inverter includes a plurality of device layers oriented vertically in a stack, each device layer having a source region, a drain region and a plurality of nanowire channels connecting the source region and the drain region, wherein the source and drain regions of one or more of the device layers are doped with an n-type dopant and the source and drain regions of one or more other of the device layers are doped with a p-type dopant; a gate common to each of the device layers surrounding the nanowire channels; a first contact to the source regions of the one or more device layers doped with an n-type dopant; a second contact to the source regions of the one or more device layers doped with a p-type dopant; and a third contact common to the drain regions of each of the device layers.

In another aspect of the invention, a method of fabricating a FET inverter is provided. The method includes the following steps. A plurality of device layers oriented vertically in a stack are formed, each device layer having a source region, a drain region and a plurality of nanowire channels connecting the source region and the drain region. An n-type dopant is introduced into the source and drain regions of one or more of the device layers. A p-type dopant is introduced into the source and drain regions of one or more other of the device layers. A gate common to each of the device layers is formed surrounding the nanowire channels. A first contact to the source regions of the one or more device layers doped with an n-type dopant is formed. A second contact to the source regions of the one or more device layers doped with a p-type dopant is formed. A third contact common to the drain regions of each of the device layers is formed.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-16 are diagrams illustrating an exemplary methodology for fabricating a gate-all-around (GAA) nanowire-based field-effect transistor (FET) inverter. As will be described in detail below, the present techniques make use of a damascene gate process to construct source/drain regions that are self-aligned with the gate.

Figure 1:
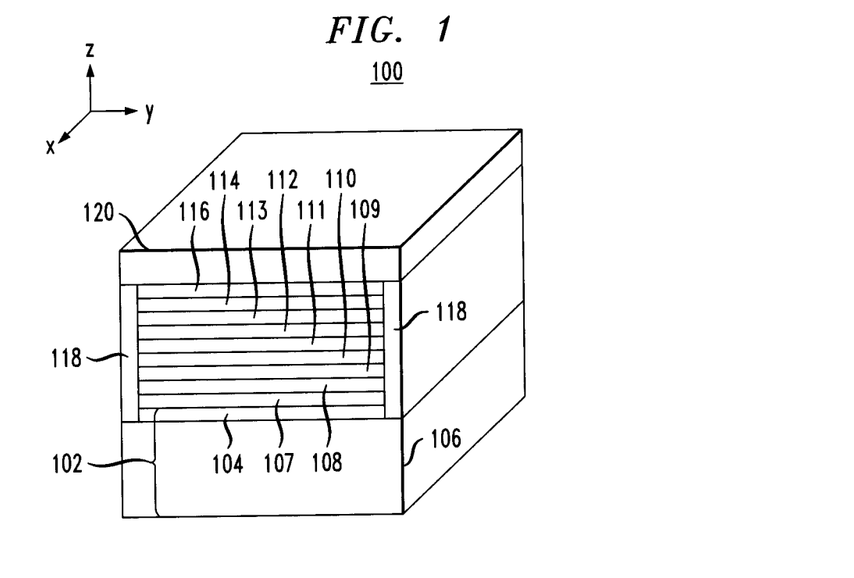
FIG. 1 is a cross-sectional diagram illustrating a starting structure for field-effect transistor (FET) inverter fabrication according to an embodiment of the present invention.

FIG. 1 is a cross-sectional diagram illustrating a starting structure 100 for the FET inverter fabrication process. To form structure 100, shallow trench isolation (STI) is used to define an active area in a silicon-on-insulator (SOI) wafer. Namely, a wafer 102 is provided having an SOI layer 104 over a buried oxide (BOX) layer 106. An SOI wafer commonly also includes other layers, such as a substrate, which are not shown in this depiction. BOX layer 106 can comprise any suitable insulator material including, but not limited to, dielectric materials, such as silicon dioxide ($SiO_2$). While FIG. 1 illustrates the formation of a single active area, it is to be understood that a plurality of active areas can be formed in a single wafer.

An alternating series of silicon (Si) and sacrificial layers are then formed on the wafer in a stack, with SOI layer 104 as the first Si layer in the series. Specifically, starting with SOI layer 104 and moving upward, a sacrificial layer 107 is epitaxially grown over SOI layer 104.

Sacrificial layer 107 comprises a crystalline material which can be etched selectively to Si, such as silicon germanium (SiGe). Sacrificial layer 107 contains a high concentration of a dopant(s) which, when introduced into the Si layers (for example, by an anneal performed later in the process), result in either n-type or p-type Si. For example, phosphorous (P) or arsenic (As) are typical n-type dopants and boron (B) is a typical p-type dopant. Dopant concentrations of from about $1 \times 10^{19}$ atoms per cubic centimeter (atoms/cm$^3$) to about $1 \times 10^{22}$ atoms/cm$^3$ may be employed. The doping may be performed in-situ (i.e., dopants are incorporated during the growth of sacrificial layer 107) or ex-situ (after the growth of sacrificial layer 107, using techniques such as ion implantation), with ex-situ doping being preferred if adjacent n-type and p-type doped regions are needed to form adjacent NFETs and PFETs in the same layer.

An optional undoped crystalline Si layer 108 may be epitaxially grown over sacrificial layer 107. Further, one or more additional sacrificial layers and/or crystalline Si layers may optionally be epitaxially grown in an alternating fashion on top of Si layer 108, in which the properties of the additional sacrificial layer(s) are the same as sacrificial layer 107, and the properties of the additional crystalline Si layer(s) are the same as Si layer 108. For illustrative purposes and ease of depiction, one additional sacrificial layer 109 and one additional Si layer 110 are shown on top of Si layer 108. However, these layers are optional, and embodiments are anticipated herein where these layers are not present. Further, more or fewer of these layers may be present than are shown. According to an exemplary embodiment, sacrificial layers 107 and 109 are doped the same as one another.

Next, an electrically insulating layer 111 is deposited on the stack. In the exemplary configuration shown in FIG. 1, insulating layer 111 is deposited over Si layer 110. Insulating layer 111 may be deposited using chemical vapor deposition (CVD), plasma enhanced CVD (PECVD) or any suitable technique for dielectric deposition that does not induce a physical or chemical change to Si layer 110. According to an exemplary embodiment, insulating layer 111 comprises either a crystalline electrically insulating material, such as diamond, or an amorphous electrically insulating material, such as $SiO_2$.

A crystalline Si layer 112 is then formed over insulating layer 111. In the case where insulating layer 111 comprises a crystalline electrically insulating material, Si layer 112 may be epitaxially grown on insulating layer 111. In the case where insulating layer 111 comprises an amorphous electrically insulating material, Si layer 112 may be introduced on top of insulating layer 111 through wafer bonding techniques, for example, where crystalline Si layer 112 is transferred from a handle wafer.

One or more additional sacrificial layers and/or crystalline Si layers may optionally be epitaxially grown in an alternating fashion on top of Si layer 112. For illustrative purposes and ease of depiction, one sacrificial layer 113 and one Si layer 114 are shown on top of Si layer 112. However, these layers are optional, and embodiments are anticipated herein where these layers are not present. Further, more or fewer of these layers may be present than are shown.

The sacrificial layer(s) above insulating layer 111, if present, have the same properties as the sacrificial layer(s) below insulating layer 111 (e.g., sacrificial layers 107 and 109). However, the polarity of the doping (if present) in the sacrificial layer(s) above insulating layer 111 is opposite to the doping in the sacrificial layer(s) below insulating layer 111. For example, if the doping in the sacrificial layer(s) below insulating layer 111 is n-type, then the doping in the sacrificial layer(s) above insulating layer 111 is p-type, and vice versa. Unlike the sacrificial layer(s) below insulating layer 111, the sacrificial layer(s) above insulating layer 111 may optionally be left undoped. In the case where crystalline Si layer 112 is transferred through wafer bonding from a handle wafer (see above), the alternating sacrificial layer(s) and/or crystalline Si layer(s) above insulating layer 111, if present, may be grown on the handle wafer before growth of crystalline Si layer 112, and transferred to the starting substrate at the same time that crystalline Si layer 112 is transferred.

A first hardmask 116 is then deposited on the stack. In the exemplary configuration shown in FIG. 1, hardmask 116 is deposited over Si layer 114. Hardmask 116 can have the same composition (e.g., $SiO_2$) and can be deposited in the same manner as insulating layer 111. According to an exemplary embodiment, hardmask 116 has a thickness of from about 15 nanometers (nm) to about 20 nm, e.g., about 20 nm.

As described above, each sacrificial layer may be deposited by way of an epitaxial growth process. As such, each sacrificial layer comprises a single crystalline material. According to an exemplary embodiment, each sacrificial layer has a thickness of from about five nm to about 20 nm. However, to minimize parasitic capacitance, the thickness of each sacrificial layer should be as small as possible while still leaving enough room for a gate dielectric/gate to fit in the gap formed once the sacrificial layer is removed later on in the process. Similarly, each Si layer described above may be deposited by way of an epitaxial growth process. As such, each Si layer also comprises a single crystalline material. According to an exemplary embodiment, each Si layer has a thickness of from about five nm to about 20 nm.

The epitaxial growth process used to form the Si and/or sacrificial layers may be performed at a temperature of less than about 800 degrees Celsius (° C.), e.g., less than about 650° C. The process can be carried out without breaking vacuum between the growth of each layer, or alternatively, vacuum can be broken between layers to enable extra processing, e.g., ex-situ doping of a particular layer. Notwithstanding whether the vacuum is broken or not between layers, a purge step is preferably performed between each successive layer formation. The growth pressure employed in forming each of the Si and sacrificial layers is less than about 100 torr, e.g., less than about 50 torr. It is notable that with these exemplary epitaxial growth parameters the thickness of each of the Si and sacrificial layers should vary by no more than about five percent (%). Portions of the Si layers will be used to form nanowire channels later on in the fabrication process, and the thickness of each sacrificial layer will determine a distance between nanowire channels in a z-direction.

STI is used to planarize and isolate the Si/sacrificial layer stack to the active area of the wafer. STI involves common lithography and etching processes which are well known to those of skill in the art, and thus are not described further herein. STI is generally employed with process technology in the nanometer feature size range. A nitride liner 118 is formed adjacent to one or more sidewalls of the stack using a deposition process, such as CVD, PECVD or atomic layer deposition (ALD). The stack now formed in the active area of the wafer will be used later in the process to form nanowire channels of the inverter. Thus, the configuration of the various layers of the stack defines the location of nanowires in the z-direction.

A second hardmask 120 is then deposited over the stack. According to an exemplary embodiment, hardmask 120 comprises a nitride layer and is deposited using low-pressure chemical vapor deposition (LPCVD) to a thickness of from about 15 nm to about 20 nm, e.g., about 20 nm. As will be described in detail below, hardmask 116 and hardmask 120 will be patterned (in accordance with a desired location of the nanowires in the x-direction) into a plurality of individual nanowire hardmasks.

Figure 2:
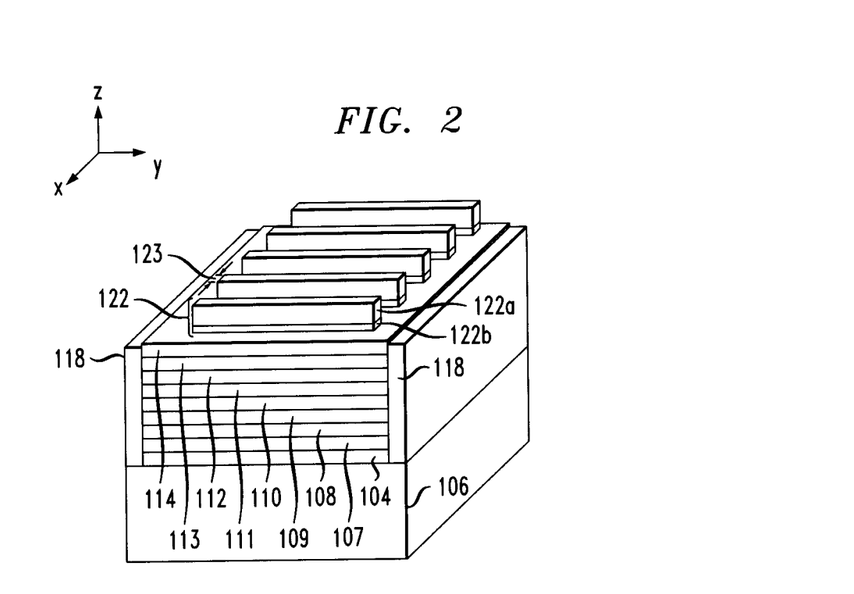
FIG. 2 a cross-sectional diagram illustrating a plurality of nanowire hardmasks according to an embodiment of the present invention.

FIG. 2 is a cross-sectional diagram illustrating the first and second hardmasks patterned into a plurality of individual nanowire hardmasks 122. As highlighted above, the patterning of the hardmasks is commensurate with a desired location of the nanowires. According to an exemplary embodiment, a resist film (not shown) is deposited on hardmask 120 and patterned with the footprint and location of each of the nanowire hardmasks 122. In one example, reactive ion etching (RIE) is used to form the nanowire hardmasks, and therefore the resist film comprises a resist material such as hydrogen silsesquioxane (HSQ) patterned using electron beam (e-beam) lithography and transferred to a carbon-based resist.

A hardmask open stage is then performed using a series of selective RIE steps based on the fact that the first hardmask comprises an oxide, while the second hardmask comprises a nitride. For example, a nitride-selective RIE using the resist film (not shown) as a mask is first used to remove all but the portions of hardmask 120 beneath the resist film, defining a nitride portion 122a of the nanowire hardmasks. Hardmask 116, which comprises an oxide, acts as an etch stop for the nitride-selective RIE. The nitride-selective RIE can also at the same time etch nitride liner 118, with Si layer 114 acting as an etch stop.

Next, using the nitride portion as a mask, an oxide-selective RIE is used to remove all but the portions of hardmask 116 beneath the nitride mask, defining an oxide portion 122b of the nanowire hardmasks. Si layer 114 acts as an etch stop for the oxide-selective RIE. In this example, the nitride portions 122a and the oxide portions 122b of the nanowire hardmasks each have thicknesses of from about 15 nm to about 20 nm, e.g., about 20 nm.

Nitride portion 122a and oxide portion 122b form a dual nanowire hardmask structure. The use of a dual nanowire hardmask structure permits more precise and uniform nanowires to be formed in the Si layers. Namely, with the dual hardmask structure, the nitride portion 122a protects the integrity of the oxide portion 122b during dummy gate definition (see FIG. 3, described below), and the oxide portion 122b protects the nanowires during spacer (nitride-selective) etch (see description below). Maintaining good integrity of the nanowire hardmasks is important for minimizing variations in nanowire dimensions. As device sizes become increasingly smaller, the effect of unwanted dimensional variations becomes even more pronounced.

In this example, the nanowire hardmasks 122 are configured to have a pitch, i.e., a spatial frequency, of less than about 200 nm, for example, from about 10 nm to about 200 nm, e.g., from about 40 nm to about 50 nm. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching can be used. A width 123 of each nanowire hardmask 122 is less than about 40 nm, for example, from about five nm to about 40 nm, e.g., from about five nm to about 10 nm. The pitch/width of each nanowire hardmask 122 will determine a pitch/width of each nanowire.

Figure 3:
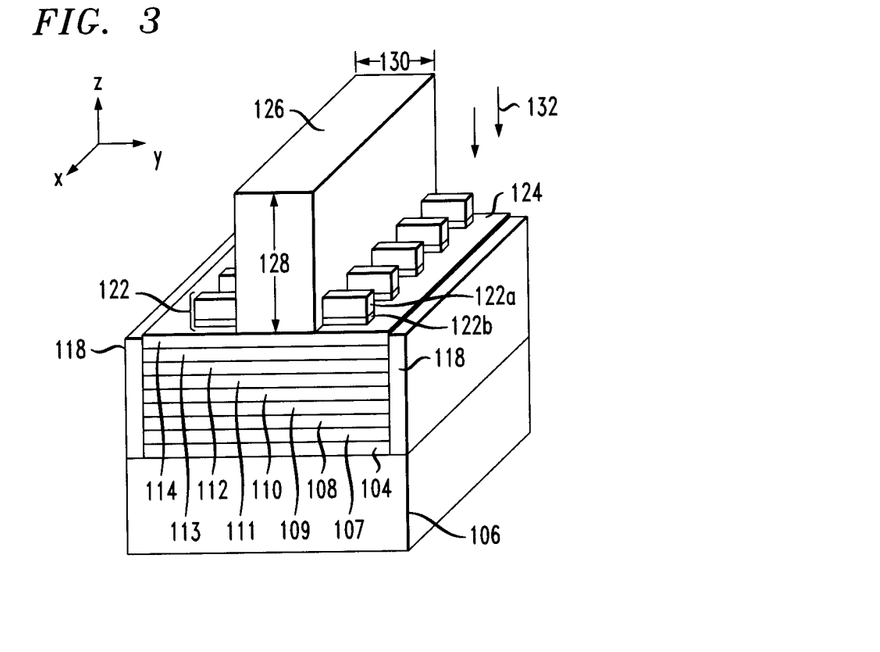
FIG. 3 is a cross-sectional diagram illustrating a dummy gate formed over an active area of the inverter according to an embodiment of the present invention.

FIG. 3 is a cross-sectional diagram illustrating a dummy gate 126 formed over the active area. As shown in FIG. 3, an oxide stopping layer, i.e., oxide layer 124, is formed on Si layer 114. According to an exemplary embodiment, thermal oxidation is used to grow oxide layer 124 to a thickness of up to about four nm, e.g., up to about two nm. A portion of Si layer 114 is consumed during this thermal oxidation process. Thus, the thickness of Si layer 114 is reduced, for example, by about two nm, e.g., by up to about one nm.

To begin the damascene gate process, dummy gate structure 126 is formed. As will be apparent from the description that follows, dummy gate structure 126 defines a location of the nanowires in a y-direction, as well as a location of a gate of the final device structure. According to an exemplary embodiment, the dummy gate structure comprises polycrystalline Si (polysilicon).

Dummy gate structure 126 can be formed by the following process. A polysilicon layer is first deposited over oxide layer 124/nanowire hardmasks 122 using LPCVD to a thickness of from about 100 nm to about 150 nm, e.g., about 140 nm. Since the thickness of the polysilicon layer will determine a height of the dummy gate, chemical-mechanical polishing (CMP) may be used after deposition to achieve a desired thickness/height. A resist film (not shown) is deposited on the polysilicon layer, masked and patterned with a footprint and location of the dummy gate (over what is to be the nanowire channels of the inverter). Polysilicon-selective RIE is then used to remove all but a portion of the polysilicon layer located over the nanowire hardmasks (i.e., centered over the nanowire hardmasks in the y-direction), which is dummy gate 126. According to an exemplary embodiment, dummy gate 126 has a height 128 of from about 100 nm to about 150 nm, e.g., about 140 nm, and a length 130 of from about 30 nm to about 50 nm, e.g., about 45 nm.

As indicated by arrows 132, a top-down implant may optionally be used to dope one or more of the crystalline Si layers above insulating layer 111. The polarity of doping of this top-down implant should be the opposite of the doping in the sacrificial layer(s) below insulating layer 111. For example, if the doping in the sacrificial layer(s) (i.e., sacrificial layer 107 and any one of the optional sacrificial layers, if present) below insulating layer 111 is n-type, then the doping in the Si layers above insulating layer 111 is p-type, and vice versa. This top-down implant step is necessary only if no sacrificial layers are present above insulating layer 111, or if the sacrificial layers that are present above insulating layer 111 were not already doped in a previous step. The depth of the top-down implant is chosen to affect the layers above insulating layer 111, but not the layers below insulating layer 111. The conditions for this implant are well known to those skilled in the art and may vary depending on the type of dopant species employed. According to an exemplary embodiment, the implant is used to dope the uppermost Si layer in the stack, i.e., Si layer 114.

Figure 4:
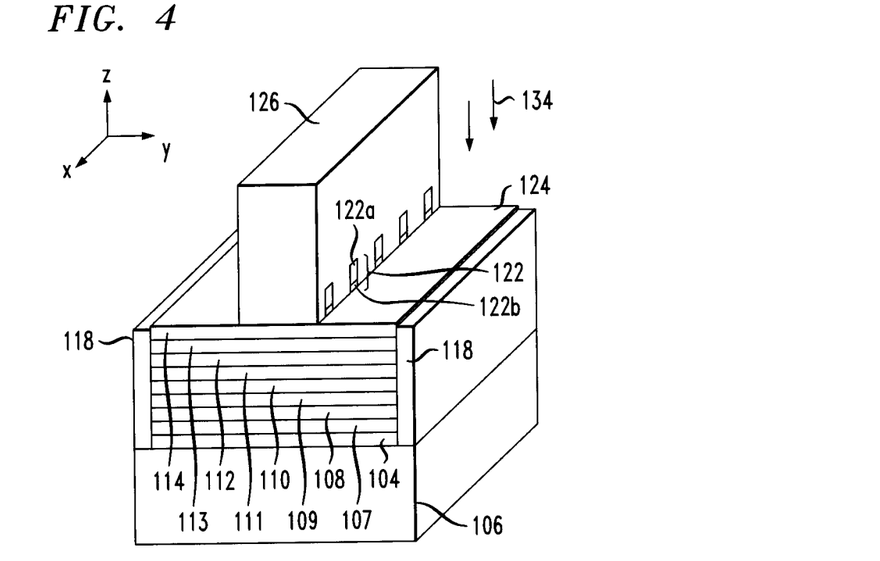
FIG. 4 is a cross-sectional diagram illustrating the nanowire hardmasks trimmed around the dummy gate according to an embodiment of the present invention.

FIG. 4 is a cross-sectional diagram illustrating the nanowire hardmasks trimmed around the dummy gate. Portions of the nanowire hardmasks 122 extending out from under dummy gate 126 can be removed using an anisotropic etch that is selective to the dummy gate material (i.e., does not etch the dummy gate). As indicated by arrows 134, the top-down implant described in conjunction with the description of FIG. 3, above may instead be performed at this point in the process, i.e., after rather than before the removal of the portions of the nanowire hardmasks 122 extending out from under dummy gate 126.

Figure 5:
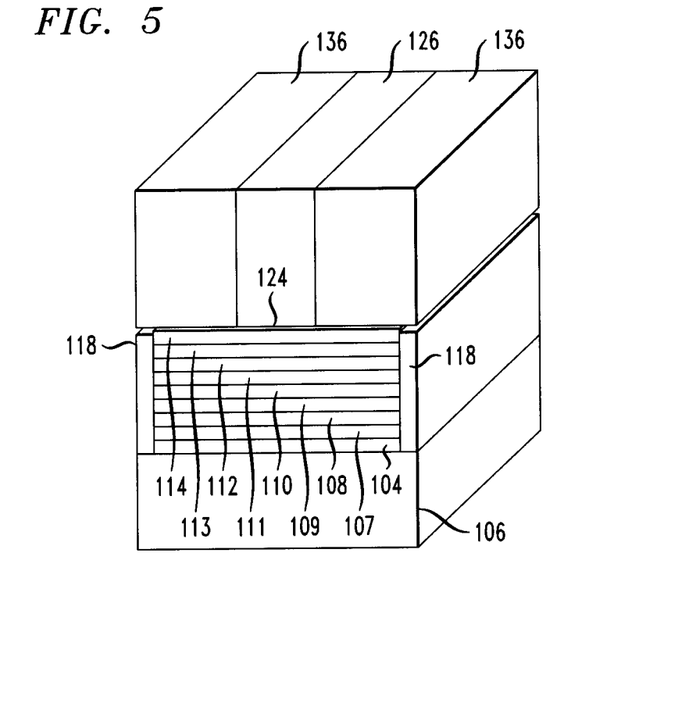
FIG. 5 is a cross-sectional diagram illustrating a filler layer deposited around the dummy gate according to an embodiment of the present invention.

FIG. 5 is a cross-sectional diagram illustrating a (sacrificial) filler layer 136 deposited around dummy gate 126. Filler layer 136 can comprise any suitable filler material, including a dielectric material, such as $SiO_2$. According to an exemplary embodiment, filler layer 136 is deposited around dummy gate 126 using a high-density plasma (HDP). CMP is then used to planarize the filler material, using the dummy gate as an etch stop. Thus, filler layer 136 will have a thickness equivalent to the height of the dummy gate, e.g., from about 30 nm to about 150 nm, e.g., from about 100 nm to about 150 nm, e.g., about 140 nm.

Figure 6:
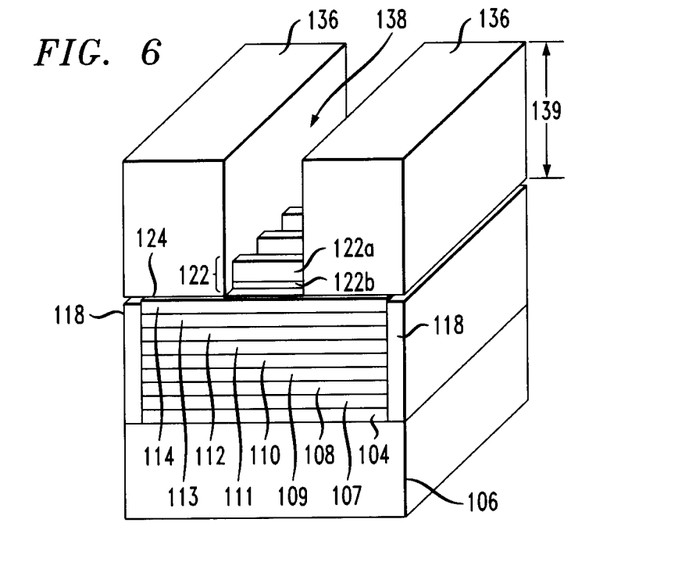
FIG. 6 is a cross-sectional diagram illustrating the dummy gate having been removed resulting in a trench being formed in the filler layer according to an embodiment of the present invention.

FIG. 6 is a cross-sectional diagram illustrating the dummy gate having been removed. Dummy gate 126 can be removed using a chemical etching process, such as chemical down stream or potassium hydroxide (KOH) etching, or RIE. As shown in FIG. 6, removal of dummy gate 126 results in a trench 138 being formed in filler layer 136. Since trench 138 is a negative pattern of dummy gate 126, trench 138 is also centrally located (i.e., in a y-direction) over nanowire hardmasks 122. According to an exemplary embodiment, trench 138 distinguishes a (nanowire) channel region of the device from source and drain regions of the device.

The etching may also have an effect on the filler layer 136, removing a portion thereof. For example, after the etch process to remove dummy gate 126, filler layer 136 can be reduced to a thickness 139 of from about 30 nm to about 125 nm, e.g., about 80 nm.

The use of a dummy gate is an important aspect of the present techniques. Namely, the dummy gate allows for the nanowire hardmasks to be placed prior to the filler layer, such that when the dummy gate is removed, the nanowire hardmasks revealed are already present within the trench. The nanowire hardmasks are important for more precise and uniform nanowires to be formed in the active region.

Figure 7:
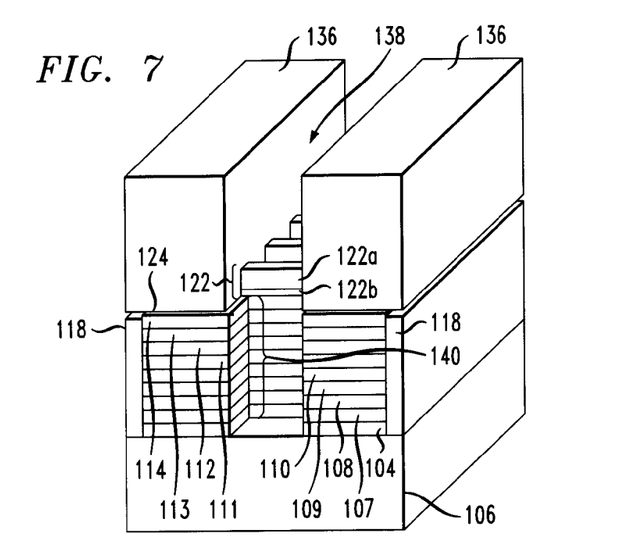
FIG. 7 is a cross-sectional diagram illustrating fin stacks according to an embodiment of the present invention.

FIG. 7 is a cross-sectional diagram illustrating fin stacks 140 etched into the Si/sacrificial layers. The fins formed in the Si layers, once released from the sacrificial layers as described below, will be the nanowire channels of the inverter. According to an exemplary embodiment, a Si-selective RIE is used to remove portions of the Si/sacrificial layers in trench 138 not masked by the nanowire hardmasks 122. BOX layer 106 acts as an etch stop for the fin etch. The fin stacks 140 patterned in this manner will have sharp, well-defined edges. As described above, this is a result of using a dual (nitride/oxide) hardmask to pattern the nanowires.

An advantage of the present teachings is that the fins are etched only within trench 138, leaving the source/drain regions of the device intact below filler layer 136. Further, the source/drain regions produced in this manner will be self-aligned with trench 138 and thus with a device gate that will be formed in trench 138 (see description below). Based on the pitch and width of the nanowire hardmasks 122, the fins formed (including those formed in the Si layers that will be the nanowire channels of the inerter) have a pitch, i.e., a spatial frequency, of less than about 200 nm, for example, from about 10 nm to about 200 nm, e.g., from about 40 nm to about 50 nm, and a width of less than about 40 nm, for example, from about five nm to about 40 nm, e.g., from about five nm to about 10 nm.

Figure 8:
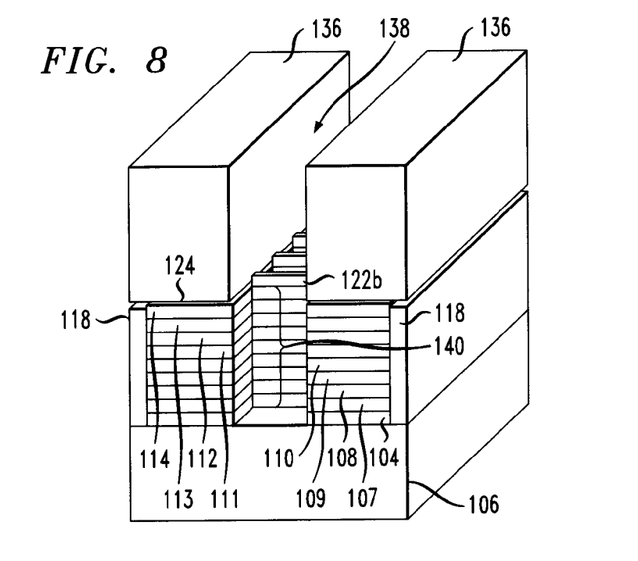
FIG. 8 is a cross-sectional diagram illustrating exposed nitride portions of the nanowire hardmasks removed according to an embodiment of the present invention.

FIG. 8 is a cross-sectional diagram illustrating the exposed nitride portions 122a (i.e., portions within trench 138) of the nanowire hardmasks having been removed. Any etching process selective for removal of the nitride portions of the nanowire hardmasks relative to the oxide portions may be used. Ideally, however, the thickness of the nitride portion should have been chosen such that it is mostly consumed during the previous fin etch, so there should not be much left on the hardmask structure at this point. The oxide portion 122b of the hardmask is ideally designed so that it is entirely consumed during the spacer etch (see FIG. 9, described below). Any of the oxide hardmask remaining after the spacer etch should be thin enough to be removed during a clean preceding gate stack deposition. The gate stack pre-clean is a standard process that removes organic contaminants, metallic contaminants and any native oxide on the surface of the Si. The native oxides can be removed using either a wet or dry chemical etch process for removing oxide. An example would be 100:1 dilute hydrofluoric acid (HF).

Figure 9:
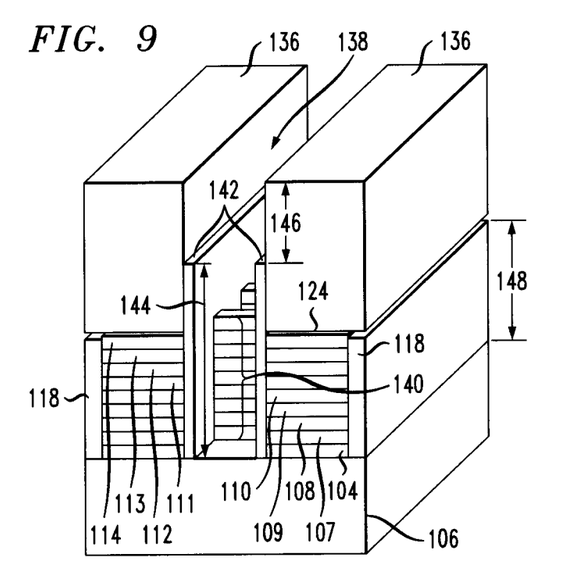
FIG. 9 is a cross-sectional diagram illustrating spacers formed in the trench according to an embodiment of the present invention.

FIG. 9 is a cross-sectional diagram illustrating spacers 142 formed in trench 138. This step is optional. Placing spacers between what will be the source/drain regions and the gate (that will be formed in trench 138, see FIG. 12, described below) will help to minimize parasitic capacitance in the completed device, but is not necessary for preventing gate-to-source/drain shorting during raised source/drain (RSD) epitaxial growth or silicide, i.e., as in typical FET flows. Spacers 142 serve to offset the gate a certain distance from the source/drain regions.

According to an exemplary embodiment, spacers 142 are formed by first depositing a nitride layer into trench 138. A resist film (not shown) is then deposited on the nitride layer, masked and patterned with a location and footprint of the spacers. A nitride-selective RIE is then used to define spacers 142 in the nitride layer. A large timed overetch is needed to clear the sidewalls of the fin stacks 140, such that the spacers 142 are present only along the sidewalls of the trench 138 and not on the fin stacks 140. The minimum pulldown of spacers 142 is thus the height of the fin stacks and remaining (oxide portion 122b) nanowire hardmasks. For example, the amount of overetch is between about 50% and about 80% of the etch time required to remove the entire nitride layer. According to an exemplary embodiment, spacers 142 have a length 144 of from about five nm to about 25 nm. A maximum height of spacers 142 is equal to thickness 139 of trench 138 less height 146 of the spacer pulldown. A minimum height of the spacers is height 148 of the fin stacks 140. The oxide portion 122b of the hardmask is exposed during the long overetch required to remove the nitride layer, and will most likely be eroded during this step due to imperfect selectivity of the nitride etch used to remove the nitride layer. Ideally, the oxide portion 122b of the hardmask is designed to be just thick enough to be completely eroded during this step.

Figure 10:
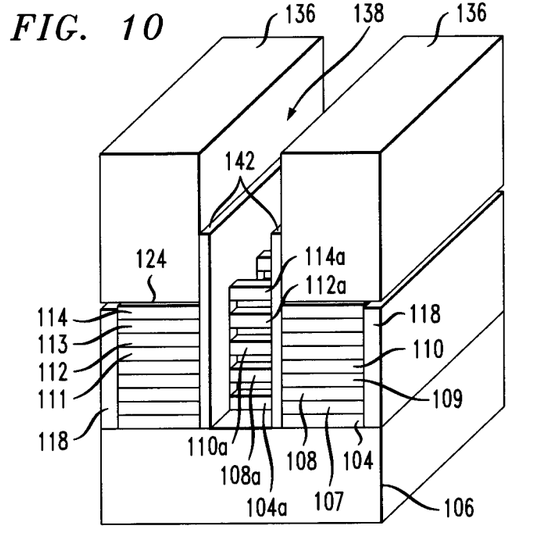
FIG. 10 is a cross-sectional diagram illustrating sacrificial layers removed from the fin stacks according to an embodiment of the present invention.

FIG. 10 is a cross-sectional diagram illustrating the sacrificial layers having been removed from between the Si layers in the nanowire fin stacks. The now released portions 104a, 108a, 110a, 112a and 114a of SOI layer 104 and Si layers 108, 110, 112 and 114, respectively, are the nanowire channels of the device. These multiple layers of nanowire channels are also referred to herein as a nanowire "mesh."

The sacrificial layers may be removed from the fin stack as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$): acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching. The electrically insulating layer may be removed using $HF:H_2O_2:CH_3COOH$ if the electrically insulating layer is an oxide. A straight DHF etch can also be used. If the electrically insulating layer is a crystalline dielectric, a different etch would be required, for example, using an etchant that is selective to Si.

Figure 11:
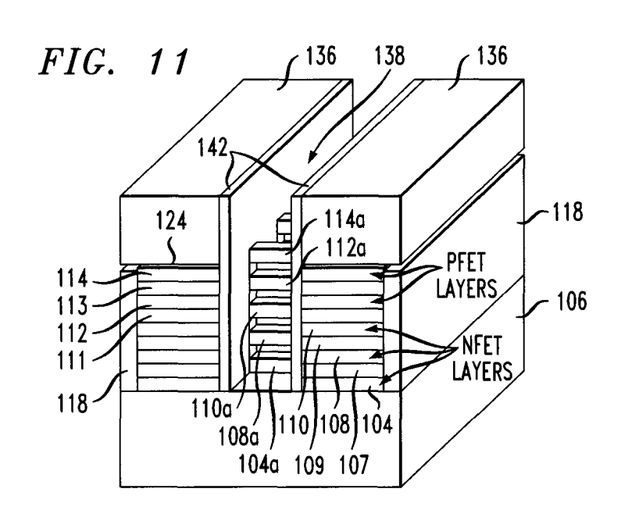
FIG. 11 is a cross-sectional diagram illustrating distinct n-doped and p-doped layers formed in the FET inverter according to an embodiment of the present invention.

FIG. 11 is a cross-sectional diagram illustrating n-doped and p-doped layers formed in the FET inverter. At this point in the fabrication process, distinct layers of the FET inverter are distinguishable. These layers are also referred to herein as device layers since each layer includes a source region and a drain region (e.g., portions of SOI layer 104 and Si layers 108, 110, 112 and 114 under filler layer 136) and a plurality of nanowire channels (i.e., portions 104a, 108a, 110a, 112a and 114a of SOI layer 104 and Si layers 108, 110, 112 and 114, respectively) connecting the source and drain regions. An exemplary configuration of these device layers is shown in FIG. 11, with the n-doped device layers labeled "NFET layers" and the p-doped device layer labeled "PFET layer." As will be described in detail below, the device layers share a common gate. Even though two given device layers might be separated from one another by a gap, or by another layer(s), these two device layers are, for the purposes of the description of the device layer stack, considered to be adjacent device layers. For example, the three NFET device layers shown in FIG. 11 are considered adjacent layers to one another, even though they may be separated by a sacrificial layer in the source and drain regions.

According to an exemplary embodiment, there are one or more sacrificial layers below electrically insulating layer 111 that were doped with an n-type dopant and there are one or more sacrificial layers above electrically insulating layer 111 that were doped with a p-type dopant. An anneal is then performed to diffuse/activate the n-type dopant from the sacrificial layer(s) below electrically insulating layer 111 (present now only in the source and drain regions) throughout the source/drain regions of the NFET device layers and to diffuse/activate the p-type dopant from the sacrificial layer(s) above electrically insulating layer 111 (present now only in the source and drain regions) throughout the source/drain regions of the PFET device layer. Temperatures for this anneal may range from about 1,000° C. to about 1,100° C., and the anneal may vary in duration from a few milliseconds (ms), for example five ms, to a few seconds, for example, five seconds. The nanowire channels remain undoped which is an important advantage of thin channel, fully depleted devices such as nanowire FETs. Prior to placing a gate (see below), filler layer 136 is planed down to spacers 142 using, e.g., CMP, a wet chemical clean is performed to remove surface contamination and native oxide and a gate dielectric is formed on the nanowire channels.

Figure 12:
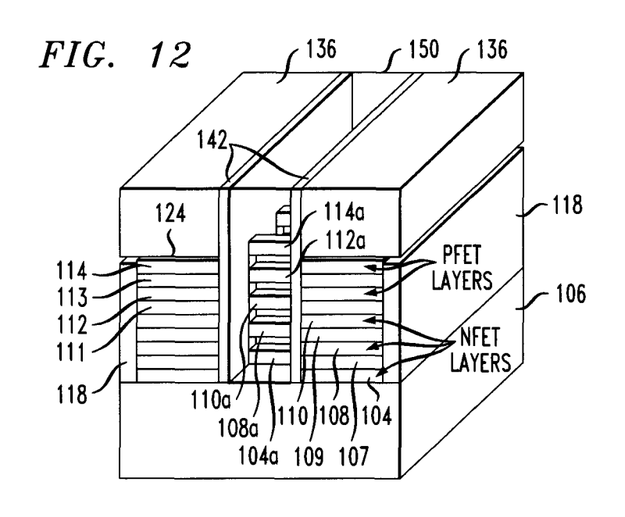
FIG. 12 is a cross-sectional diagram illustrating a replacement gate formed in the trench according to an embodiment of the present invention.

According to an exemplary embodiment, differential chemical oxidation is used to preferentially oxidize the regions of sacrificial material in the source/drain regions which are not covered by a spacer. These regions of sacrificial material can be oxidized preferentially to the exposed Si nanowire channel regions. Then, a dielectric, e.g., $SiO_2$ or a high-K gate dielectric such as hafnium oxide ($HfO_2$) is formed on the nanowire channels. This is the gate dielectric (which will separate the gate from the nanowire channels). Next, as shown in FIG. 12, a cross-sectional diagram, a replacement gate 150 is formed in trench 138 surrounding the nanowire channels by filling trench 138 with a gate material. Once the gate material is filled into trench 138, CMP is used to planarize the gate with filler layer 136 acting as an etch stop. Suitable gate materials include, but are not limited to, one or more of polysilicon, a deposited metal(s) and a hybrid stack of multiple materials such as metal polysilicon.

Figure 13:
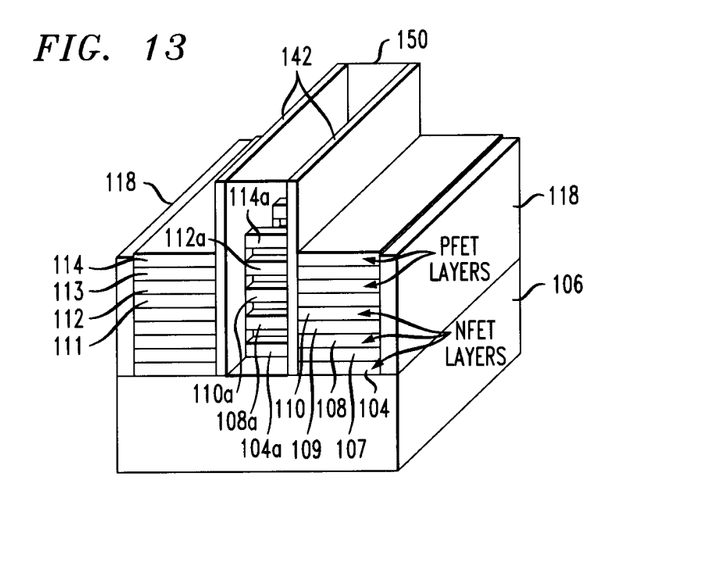
FIG. 13 is a cross-sectional diagram illustrating the filler layer removed according to an embodiment of the present invention.

FIG. 13 is a cross-sectional diagram illustrating the filler layer 136 removed. According to an exemplary embodiment, filler layer 136 comprises $SiO_2$ and is removed using an oxide-selective etching process, such as an oxide-selective RIE. Oxide layer 124 is also removed by this etching process. Filler layer 136 and oxide layer 124 are removed to permit contact formation in the source and drain regions of the various device layers, see below.

Figure 14:
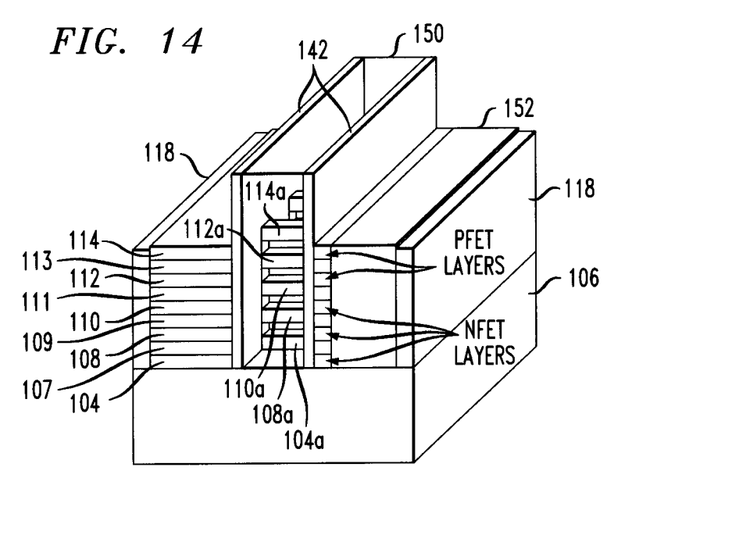
FIG. 14 is a cross-sectional diagram illustrating a drain region contact according to an embodiment of the present invention.

FIG. 14 is a cross-sectional diagram illustrating a contact 152 formed in the drain regions of the device layers. In the orientation shown in FIG. 14, the portions of the device layers to the left of the gate are arbitrarily designated as the source regions and the portions of the device layers to the right of the gate are designated as the drain regions.

According to an exemplary embodiment, contact 152 is formed by first blanket depositing a hardmask (not shown) and patterning the hardmask with a location and footprint of contact 152. A recess etch (or a combination of etch steps) is then performed through the patterned hardmask to form a trench throughout the drain regions of the device layers. The hardmask is then removed.

A silicide layer is formed in the trench using standard methods well known to those of skill in the art. For example, a layer comprising a metal such as nickel (Ni) is deposited to a thickness of from about five nm to about 30 nm, e.g., about 15 nm. The wafer is then annealed at a temperature of from about 350° C. to about 500° C., e.g., 450° C., for a duration of a few ms, for example five ms, to a few seconds, for example, five seconds, so that exposed Si reacts with the Ni to form a nickel silicide. A metal etchant selective to silicide, such as aqua regia (containing nitric and hydrochloric acid), is then used to remove unreacted Ni. The thickness of the remaining silicide is determined by the thickness of the metal layer deposited and the length and temperature of the anneal. Due to volume expansion during silicide formation, silicide forming above and below the electrically insulating layer 111 will merge, forming an electrical short between the upper and lower drain regions in the Si layers above and below electrically insulating layer 111. Thus, the silicide layer, which makes up contact 152, is common to the drain regions of each of the device layers and serves to short the NFET and PFET device layers on the drain region side.

Figure 15:
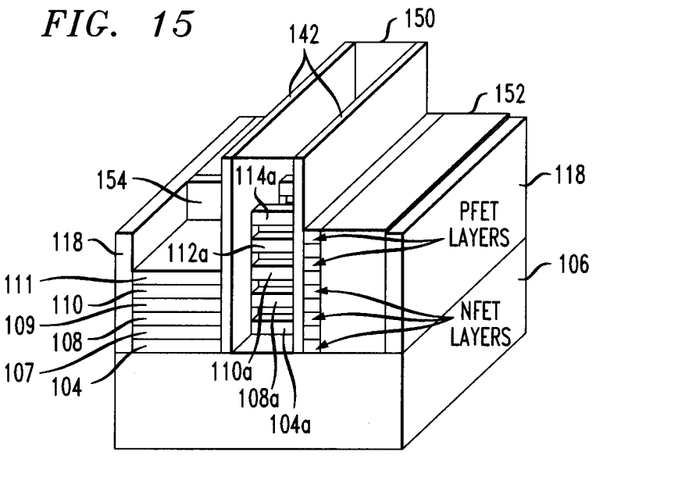
FIG. 15 is a cross-sectional diagram illustrating source region isolation according to an embodiment of the present invention.

FIG. 15 is a cross-sectional diagram illustrating source region isolation. Specifically, as a precursor to contact formation in the source regions of the device layers (see FIG. 16, described below), the NFET and PFET device layers on the source side have to be isolated from one another. According to an exemplary embodiment, this isolation is achieved by first removing a portion, e.g., one half, of all Si and sacrificial layers above electrically insulating layer 111 (i.e., Si layer 114, sacrificial layer 113 and Si layer 112) in the source region. To do so, a hardmask (not shown) can be blanket deposited and patterned with a location and footprint of the portion of Si layer to be removed. An etch is performed through the patterned hardmask and the hardmask is then removed.

A spacer 154 is then used to isolate the patterned and unpatterned regions. Spacer 154 can comprise a nitride material. Spacer formation techniques were described, for example, in conjunction with the description of FIG. 9, above.

Figure 16:
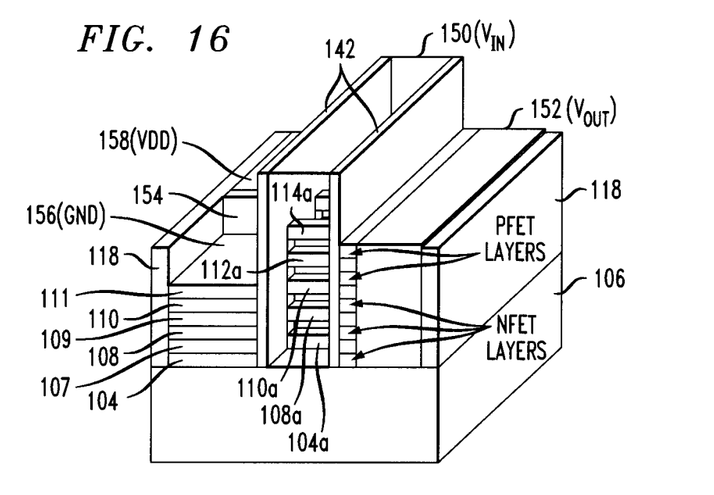
FIG. 16 is a cross-sectional diagram illustrating source region contacts according to an embodiment of the present invention.

FIG. 16 is a cross-sectional diagram illustrating contacts 156 and 158 formed in the source regions of the NFET and PFET device layers, respectively. According to an exemplary embodiment, contacts 156 and 158 are formed by repeating the silicide process described in conjunction with the description of FIG. 14, above. In this case, however, the lower source regions in the Si layers below electrically insulating layer 111 are not shorted to the upper source regions in the Si layers above electrically insulating layer 111 due to the spacer 154 that keeps them isolated.

A silicide is formed, which makes up contacts 156 and 158. As shown in FIG. 16, NFET source contact 156 serves as a ground (labeled "GND") contact of the inverter, PFET source contact 158 serves as a power (labeled "VDD") contact of the inverter, gate 150 serves as an input (labeled "$V_{IN}$") contact of the inverter and NFET/PFET drain contact 152 serves as an output (labeled "$V_{OUT}$") contact of the inverter. Advantageously, the present FET inverter is configured to have a single GAA gate which, when combined with the instant stacked nanowire channel design, serves to maximize layout area.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) inverter, comprising:
a plurality of device layers oriented vertically in a stack, each device layer having a source region, a drain region and a plurality of nanowire channels connecting the source region and the drain region, wherein the source and drain regions of one or more of the device layers are doped with an n-type dopant and the source and drain regions of one or more other of the device layers are doped with a p-type dopant, and wherein the nanowire channels in any given one of the device layers have a pitch of from about 10 nm to about 200 nm, and wherein the device layers are separated from one another in the stack by in-situ doped sacrificial layers which are present in the stack between the source regions and the drain regions of the device layers but not between the nanowire channels in the stack;
a gate common to each of the device layers surrounding the nanowire channels;
a first contact to the source regions of the one or more device layers doped with an n-type dopant;
a second contact to the source regions of the one or more device layers doped with a p-type dopant; and
a third contact common to the drain regions of each of the device layers.

2. The FET inverter of claim 1, wherein the nanowire channels in any given one of the device layers have a pitch of from about 40 nm to about 50 nm.

3. The FET inverter of claim 1, wherein the nanowire channels of adjacent device layers in the stack are separated from one another by a gap of from about five nm to about 20 nm based on a thickness of the sacrificial layers between the adjacent device layers in the stack.

4. The FET inverter of claim 1, wherein the n-type dopant comprises one or more of phosphorous and arsenic.

5. The FET inverter of claim 1, wherein the p-type dopant comprises boron.

6. The FET inverter of claim 1, wherein the gate is separated from the nanowire channels by a dielectric.

7. The FET inverter of claim 1, further comprising spacers between the source and drain regions of the device layers and the gate.

8. The FET inverter of claim 1, wherein the gate comprises one or more of polysilicon and a metal.

9. The FET inverter of claim 1, wherein the first contact serves as a ground contact of the inverter, the second contact serves as a power contact of the inverter, the gate serves as an input contact of the inverter and the third contact serves as an output contact of the inverter.

10. The FET inverter of claim 1, wherein the third contact shorts the drain regions of each of the device layers.

11. The FET inverter of claim 1, further comprising an electrically insulating layer separating the source and drain regions of the one or more device layers doped with the n-type dopant from the source and drain regions of the one or more device layers doped with the p-type dopant.

12. The FET inverter of claim 11, wherein the one or more device layers doped with the n-type dopant are located below the electrically insulating layer and the one or more device layers doped with the p-type dopant are located above the electrically insulating layer.

13. The FET inverter of claim 1, wherein the nanowire channels are undoped.

14. The FET inverter of claim 11, wherein the electrically insulating layer comprises a crystalline electrically insulating material such that the device layers located in the stack above the electrically insulating layer comprise an epitaxial material.

15. The FET inverter of claim 11, further comprising:
a recessed portion of the stack and an unrecessed portion of the stack in the source regions of the device layers above the electrically insulating layer, wherein the recessed portion and the unrecessed portion are separated by a spacer, and wherein the first contact is to the recessed portion of the stack and the second contact is to the unrecessed portion of the stack.

* * * * *